United States Patent [19]

Thakur et al.

[11] Patent Number: 5,672,539

[45] Date of Patent: Sep. 30, 1997

[54] METHOD FOR FORMING AN IMPROVED FIELD ISOLATION STRUCTURE USING OZONE ENHANCED OXIDATION AND TAPERING

[75] Inventors: Randhir P. S. Thakur; J. Brett Rolfson; Fernando Gonzalez, all of Boise; John T. Moore, Meridan, all of Id.

[73] Assignee: Micron Technology, Inc., Boise, Id.

[21] Appl. No.: 538,732

[22] Filed: Oct. 3, 1995

Related U.S. Application Data

[63] Continuation-in-part of Ser. No. 264,313, Jun. 23, 1994, abandoned, which is a continuation-in-part of Ser. No. 181,650, Jan. 14, 1994, abandoned.

[51] Int. Cl.$^6$ .................................................. H01L 21/76
[52] U.S. Cl. ...................... 437/70; 437/69; 437/947
[58] Field of Search ............................ 437/69, 70, 72, 437/73, 947

[56] References Cited

U.S. PATENT DOCUMENTS

| | | | |
|---|---|---|---|
| 4,341,592 | 7/1982 | Shortes et al. | 156/643 |
| 4,743,566 | 5/1988 | Bastiaens et al. | 437/69 |
| 4,845,054 | 7/1989 | Mitchener | 437/238 |
| 5,127,365 | 7/1992 | Koyama et al. | 118/724 |
| 5,134,089 | 7/1992 | Barden et al. | 437/69 |
| 5,151,381 | 9/1992 | Liu et al. | 437/69 |
| 5,234,501 | 8/1993 | Nakao et al. | 118/719 |
| 5,294,571 | 3/1994 | Fujishiro et al. | 437/239 |
| 5,302,233 | 4/1994 | Kim et al. | 156/636 |
| 5,330,935 | 7/1994 | Dobuzinsky et al. | 437/239 |
| 5,346,585 | 9/1994 | Doan et al. | 156/643 |
| 5,376,230 | 12/1994 | Ito | 437/69 |

FOREIGN PATENT DOCUMENTS

| | | |
|---|---|---|
| 0075636 | 4/1984 | Japan . |
| 0087821 | 5/1984 | Japan . |
| 0273440 | 9/1992 | Japan . |
| 0183050 | 7/1993 | Japan . |
| 0252137 | 9/1994 | Japan ............ 437/69 |

OTHER PUBLICATIONS

Kriegler et al., "The Effect of Hcl and Cle on the Thermal Oxidation of Silicon"; J. Electrochem. Soc: Solid State Science and Technology; vol. 119, No. 3, Mar. 1972, pp. 388–392.

*Primary Examiner*—Trung Dang
*Attorney, Agent, or Firm*—Stephen A. Gratton

[57] ABSTRACT

A method for forming a field isolation structure and an improved field isolation structure are provided. The method includes forming a field oxide on a silicon substrate using an ozone enhanced local oxidation of silicon (LOCOS) process. Following formation of the field oxide a surface topography of the field oxide is sloped or tapered by ion milling, dry etching, reactive ion etching or chemical mechanical planarization. With an ozone enhanced LOCOS process, oxidation rates are increased and stress between the field oxide and substrate are reduced. This permits the formation of field isolation structures with reduced lateral encroachment and a smaller bird's beak area. In addition, the sloped topography of the field oxide permits a subsequently deposited conductive layer (e.g., polysilicon) to be etched without the formation of conductive stringers. During the etch process the active areas on the substrate can be protected with a sacrificial oxide or by only partially removing the LOCOS mask.

34 Claims, 5 Drawing Sheets

METHOD FOR FORMING AN IMPROVED FIELD ISOLATION STRUCTURE USING OZONE ENHANCED OXIDATION AND TAPERING

CROSS-REFERENCE TO RELATED APPLICATIONS

This application is a continuation-in-part of U.S. patent application No. 08/264,313 filed on Jun. 23, 1994 now abandoned, which is a continuation-in-part of U.S. patent application Ser. No. 08/181,650 filed on Jan. 14, 1994 now abandoned.

This invention was made with Government support under Contract No. MDA972-92-C-0054 awarded by Advanced Research Projects Agency (ARPA). The Government has certain rights in this invention.

FIELD OF THE INVENTION

This invention relates to semiconductor manufacture and particularly to a method for forming a field isolation structure using an ozone enhanced oxidation chemistry and tapering.

BACKGROUND OF THE INVENTION

In semiconductor manufacture oxidation of silicon is important in forming oxides for field isolation structures and thin oxide layers for gates or other components of MOSFETS. One oxidation process that is used to separate the active regions on a silicon substrate is known as local oxidation of silicon (LOCOS). During a conventional LOCOS process, a pad oxide and a barrier layer of a material such as silicon nitride are formed on a silicon substrate. The barrier layer is then patterned and etched to expose the pad oxide or silicon substrate in certain areas. The silicon substrate is then subjected to thermal oxidation. By exposing the uncovered or exposed areas of the silicon substrate to a high temperature oxidizing atmosphere, a relatively thick field oxide (FOX) is grown only in the exposed areas. The barrier material is then removed and the substrate may then be processed further for forming the semiconductor devices.

FIGS. 1 and 2 illustrate a conventional LOCOS process. The process begins with a silicon substrate 10. A pad oxide layer 12 is formed on the substrate 10 by a suitable deposition or growth process. A silicon nitride layer 14 is deposited on the pad oxide layer 12. Typically the silicon nitride layer 14 is deposited using a low pressure chemical vapor deposition process (LPCVD) with a silane or dichlorosilane source. The silicon nitride layer 14 and pad oxide layer 12 are then patterned and etched using a photoresist mask 16. The exposed areas 18 of the substrate 10 become future field regions and the covered areas 20 of the substrate 10 become future active areas.

The substrate 10 is then thermally oxidized using an oxidizing atmosphere that includes pure oxygen and water vapor. Typically, thermal oxidation is performed in a vertical or horizontal tube furnace at a temperature of 800–1300 C. As shown in FIG. 2, this forms a field oxide (FOX) 22 over a field implant region 24 of the substrate 10. The field oxide 22 grows not only vertically in the exposed areas 18 (FIG. 1) but also laterally under the edges of the silicon nitride layer 14. This lateral oxide encroachment under the nitride layer 14 is known as the "birds beak" 26. In general, the birds beak 26 can grow to a thickness of about half the thickness of the field oxide 22.

The formation of the bird's beak 26 reduces the area of the moat region 28 available for active semiconductor devices. In addition, there is a field encroachment region 30 wherein the field implant can laterally diffuse into active areas. This encroachment tends to increase the threshold voltage (Vt) near the edges of the active devices, and the full device width is unavailable for the channel region.

In the past, various semiconductor manufacturing processes have been proposed to improve the conventional LOCOS process and to decrease the size of the bird's beak formed during the LOCOS process. These processes include: sealed interface LOCOS (SILO); side wall mask isolation (SWAMI); poly buffered LOCOS (PBL) and OSELO. One problem with these oxidation processes is that stress is produced in the oxidized layer causing crystal lattice dislocation loops. In addition, these processes require additional masking layers or oxidation steps.

In view of the foregoing, there is a need for an improved method for forming field isolation structures.

Accordingly, it is an object of the present invention to provide an improved method for forming field isolation structures using an ozone enhanced oxidation atmosphere and tapering.

It is another object of the present invention to provide an improved method for forming a field isolation structure having reduced stress and a sloped, tapered or faceted topography without detriment to adjacent semiconductor structures.

It is yet another object of the present invention to provide an improved field isolation structure formed by an ozone enhanced oxidation atmosphere and tapering.

It is a further object of the present invention to provide a method for forming a field isolation structure that is simple and adaptable to large scale semiconductor manufacture.

Other objects, advantages and capabilities of the present invention will become more apparent as the description proceeds.

SUMMARY OF THE INVENTION

In accordance with the present invention, a method for forming a field oxide structure and an improved field oxide structure are provided. The method of the invention, simply stated, comprises growing a field oxide layer in an atmosphere that includes ozone and oxygen, and then tapering the field oxide layer to form a sloped, tapered or faceted surface topography. The resultant surface topography of the field oxide allows a conductive layer (e.g., polysilicon) to be subsequently deposited, patterned and then etched without leaving residual material that can form conductive "stringers". In addition, with an ozone enhanced oxidation process, the field oxide layer is characterized by a smaller bird's beak area, less stress, and reduced lateral encroachment.

Initially, a silicon substrate is provided and a pad oxide is formed on the silicon substrate. A nitride layer is then formed on the substrate and etched to form a hard mask which leaves active areas on the substrate protected. The field oxide layer is then grown in the isolation areas of the substrate in a reaction chamber, at a temperature of about 600° C. to 1300° C., and at atmospheric pressure or less. The ozone and oxygen are mixed in a predetermined ratio, cooled to room temperature or less, and then injected into the reaction chamber. The ratio of the ozone to oxygen is between about 0.5% to 25% by volume. In addition, the gas mixture can include steam and an inert gas such as a halogen or halogen containing compound which improves the oxidation process.

Following the ozone enhanced oxidation growth process for forming the field oxide layer, the nitride mask is removed and the field oxide layer is tapered to form a sloped or tapered surface topography. A preferred method of tapering the field oxide layer is a dry etch process such as sputter etching or ion milling. Alternately, reactive ion etching, a plasma etch, chemical mechanical planarization or other suitable process can be used. The tapering process is controlled to remove just the corners of the field oxide layer and form a sloped topography.

Prior to the tapering process and in order to insure that the gate areas of devices subsequently formed in the active areas are not adversely effected by the tapering process, a relatively thick (e.g., 800) sacrificial oxide can be formed in the active areas. Alternately, the nitride hard mask can be only partially removed so that the corners of the field oxide layer are still exposed for tapering but the active areas of the substrate remain protected by the nitride mask.

An apparatus for growing the field oxide layer includes a vertical or horizontal tube furnace having a reaction chamber in flow communication with an ozone generator. The ozone generator is adapted to supply an ozone/oxygen gas mixture to the reaction chamber at a predetermined ratio of ozone to oxygen. In addition, the ozone/oxygen gas mixture is cooled to room temperature or lower, prior to injection into the reaction chamber in order maintain the stability of the mixture for transport.

DETAILED DESCRIPTION OF THE PREFERRED EMBODIMENTS

Figure 2:
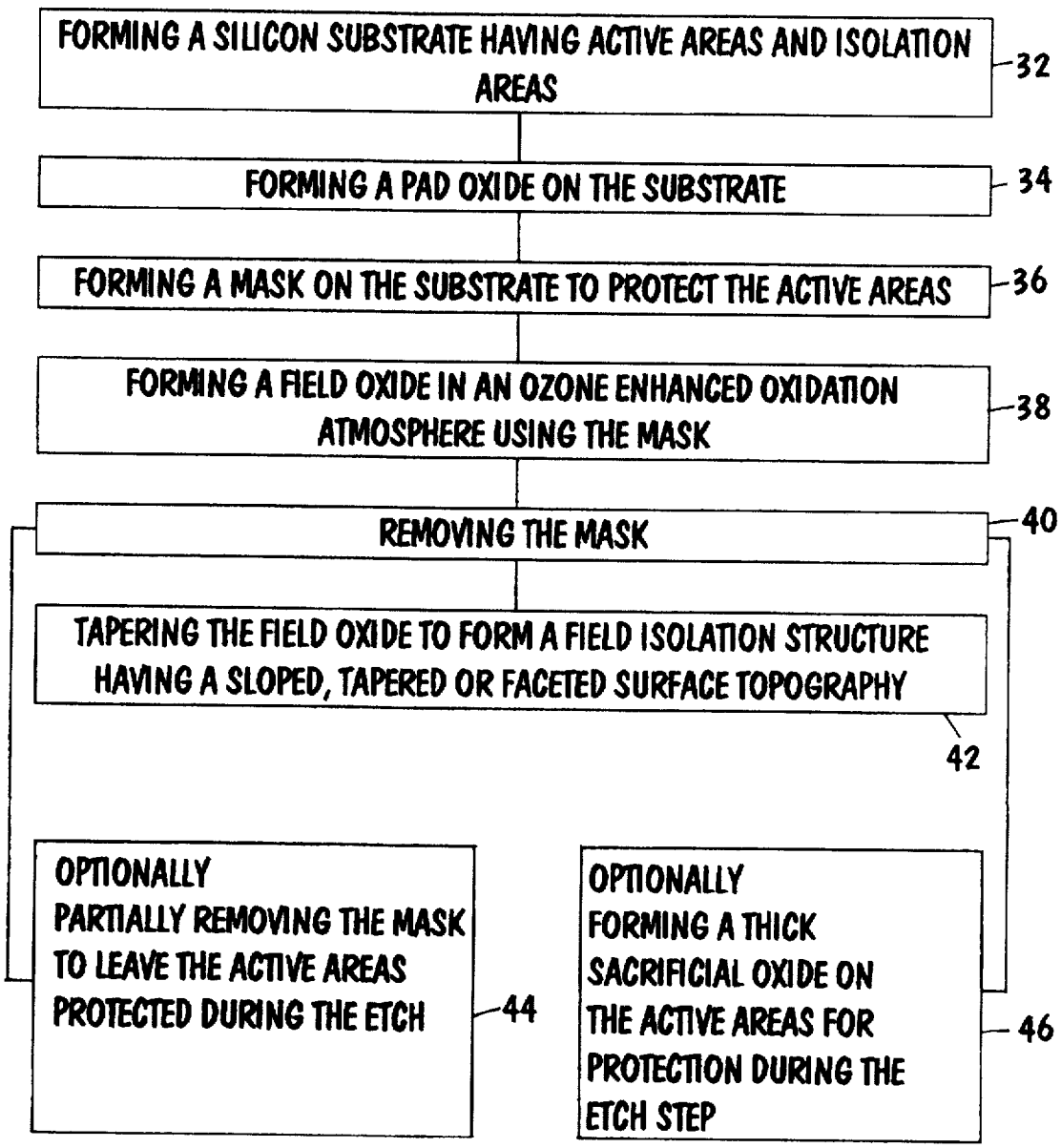
FIG. 2 is a flow diagram illustrating steps involved in forming a field oxide structure in accordance with the invention.

With reference to FIG. 2, the method of the invention, generally stated, includes the steps of:

forming a silicon substrate, having active areas and isolation areas step 32;

forming a pad oxide on the substrate, step 34;

forming a mask on the substrate to protect the active areas, step 36;

forming a field oxide in an ozone enhanced oxidation atmosphere using the mask, step 38;

removing the mask, step 40;

tapering the field oxide to form a field isolation structure in the isolation areas having a sloped, tapered or faceted surface topography, step 42.

Figure 3A:
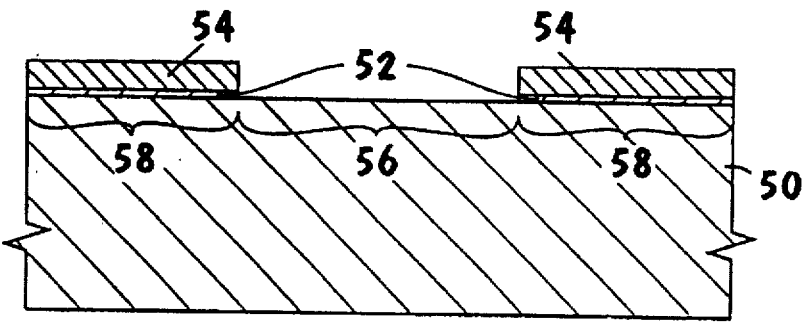
FIGS. 3A-3D are schematic cross sectional views illustrating a portion of a silicon substrate during formation of a field isolation structure in accordance with the invention.

Referring now to FIGS. 3A-3D, the process outlined in FIG. 2 is shown. Initially, as shown in FIG. 3A, a silicon substrate 50 is formed. An implant step may have previously been performed on the substrate 50 to define different regions. These regions can include various conductivity regions such as n-wells and p-wells (not shown), which can be formed by well known processes to construct elements of a FET transistor (e.g., source, drain, channel region) or other semiconductor devices.

As also shown in FIG. 3A, a pad oxide 52 is formed on the substrate 50. The pad oxide 52 can be a layer of $SiO_2$ that is grown or deposited on the substrate 50 to a desired thickness (e.g., 200–1000 Å). The pad oxide 52 can be a sacrificial pre-gate oxide that will be stripped prior to the growth of the actual gate oxide. As also shown in FIG. 3A, a silicon nitride mask 54 is formed on the substrate 50. The silicon nitride mask 54 can be deposited, patterned and etched using conventional processes. A typical thickness for the mask 54 will be about 500 Å to 3000 Å. The open areas of the mask 54 expose isolation areas 56 of the substrate 50 wherein isolation structures will be formed. The covered areas of the mask 54 protect active areas 58 wherein active devices will be formed.

Figure 3B:
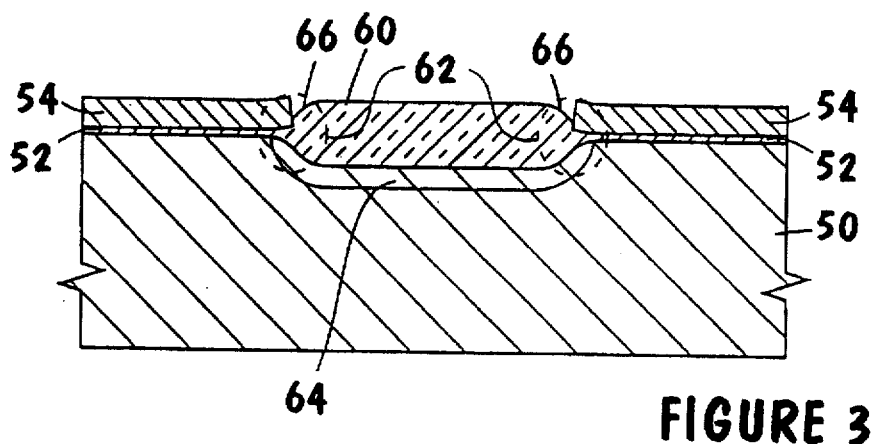

Next, as shown in FIG. 3B, a field oxide 60 is grown in the isolation areas 56 (FIG. 3A) using an ozone enhanced local oxidation of silicon (LOCOS) process. The ozone enhanced LOCOS process is performed in a reaction chamber, at a temperature of about 600° C. to 1300° C., and at atmospheric pressure or less. During the ozone enhanced LOCOS process, ozone and oxygen are mixed in a predetermined ratio, cooled to room temperature or less, and then injected into the reaction chamber. The ratio of the ozone to oxygen is between about 0.5% to 25% by volume. In addition, the gas mixture can include steam and an inert gas such as a halogen or halogen containing compound which improves the oxidation process. Using the ozone enhanced LOCOS process the field oxide can be formed with a reduced stress, smaller bird's beak and a thickness of from 2000 Å to 6000 Å.

In general, during the ozone enhanced LOCOS process, ozone ($O_3$) decomposes into diatomic oxygen ($O_2$) and atomic oxygen (O). This leaves a large number of free oxygen atoms (O) that are available to combine with silicon to form silicon dioxide ($SiO_2$). The decomposition of the ozone ($O_3$) can be represented by the formula:

$$O_3 = O_2 + O.$$

The free oxygen atoms (O) react with silicon according to the formula:

$$Si + 2O = SiO_2.$$

Normally diatomic oxygen $O_2$ is very difficult to break into atomic oxygen. The presence of ozone in the oxidizing atmosphere thus provides more free oxygen atoms for oxidation at a lower total energy expenditure. Faster oxidation rates are therefore possible at lower temperatures and with reduced stress and lateral encroachment.

Figure 1A:
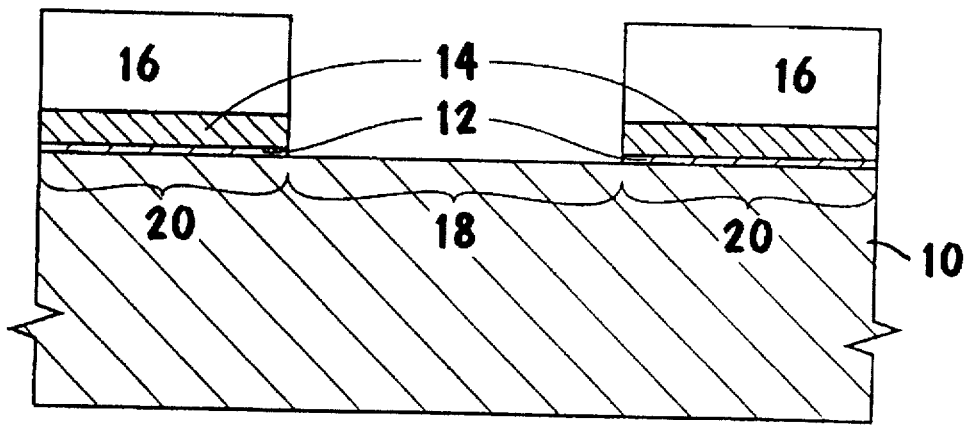
FIGS. 1A and 1B are schematic cross sectional views showing a portion of a silicon substrate during formation of a field isolation structure in accordance with a conventional prior art LOCOS process.
Figure 1B:
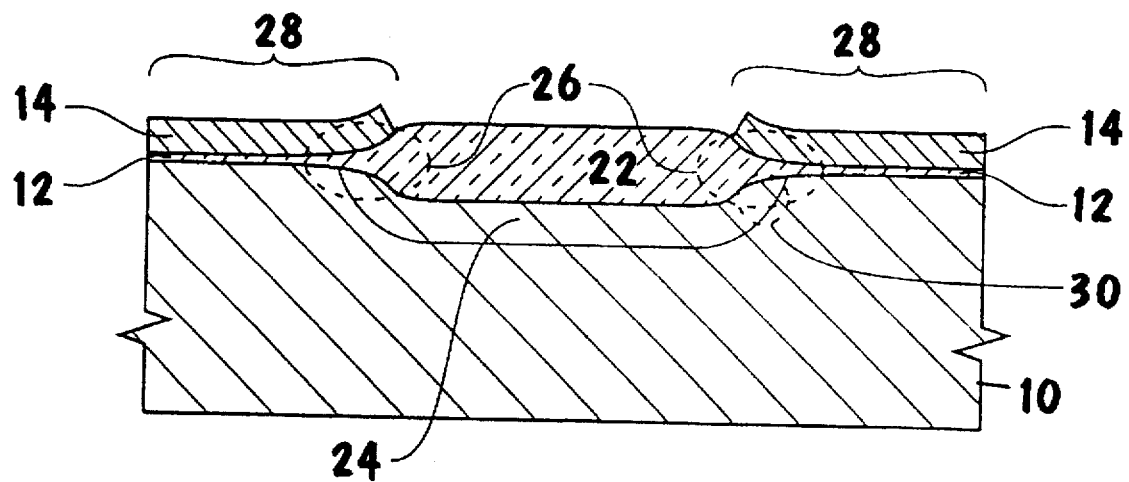

As shown in FIG. 3B, the bird's beak 62 area of the field oxide 60 grown by ozone enhanced LOCOS is smaller than with the field oxide 22 (FIG. 1B) for a conventional LOCOS process. In particular, the bird's beak 62 does not extend as far laterally beneath the mask 54. In addition, lateral encroachment of field implant dopants from the field implant region 64 is decreased.

Although the bird's beak 62 is smaller and lateral encroachment is reduced with ozone enhanced LOCOS, the surface topography of the field oxide 60 includes a step 66 on each side adjacent to the mask 54. This stepped topography is different than the surface topography of the field oxide 60 (FIG. 1B) formed by a conventional LOCOS process which is much more sloped. Accordingly, the topography of the field oxide 60 can be sloped, tapered or faceted by etching away the corners of the step 66 to form a sloped surface 75. With the sloped surface 75 a subsequently deposited conductive layer such as polysilicon 68 (FIG. 3D) can be more easily patterned and then etched without the formation of conductive stringers in unprotected areas of the pattern.

Prior to the tapering step, the mask 54 is stripped. By way of example, for a silicon nitride mask 54, a solution of hot (e.g., 180° C.) phosphoric acid ($H_3PO_4$) can be used to strip the mask 54.

Figure 3C:
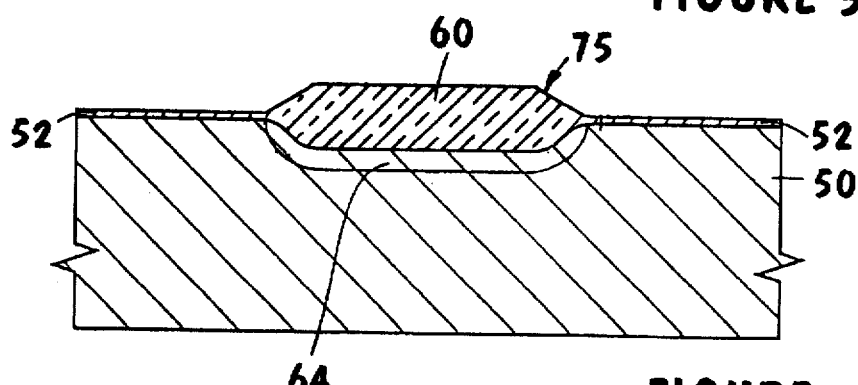
Figure 3D:
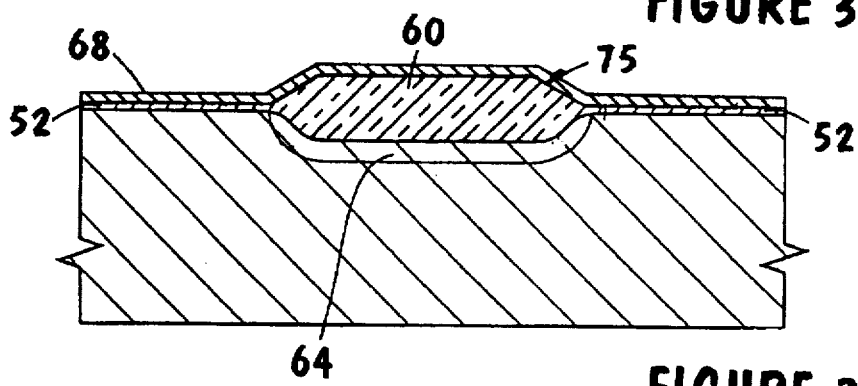

Next, as shown in FIG. 3C, a topography of the field oxide 60 is tapered to form the sloped surface 75. One suitable tapering process is ion milling. Reactive ion etching can also be utilized. By way of example, a facet etch can be performed in a reactive ion etcher using an inert gas etchant such as argon, helium or xenon. In general, an inert gas etchant can be used to etch the FOX 60 selectively with respect to the silicon substrate 50. Typical process parameters using an Applied Materials 5000 series reactive ion etcher are:

RF power: 300–700 watts
pressure: 10–30 mtorr
etchant: 30–70 sccm

Such an etch process can be used to remove from 200–800 Å of material from the field oxide 60 to form the tapered surface 75. In general, the etch process will also remove a similar thickness of the pad oxide 52 from the active areas 58. Thus a thin pad oxide 52 (e.g., 200 Å) will not be thick enough to protect the active area 58 wherein a gate oxide for a semiconductor device will typically be formed.

One other technique that can be used to form a sloped, tapered or faceted topography is to implant a neutral dopant (e.g., argon) into the field oxide 60 such that the corners will etch faster. Another technique to form a sloped, tapered or faceted topography is chemical mechanical planarization of the field oxide 60 using a relatively soft polishing pad as disclosed in U.S. Pat. No. 5,302,233 to Kim et al., which is incorporated herein by reference.

Figure 4B:
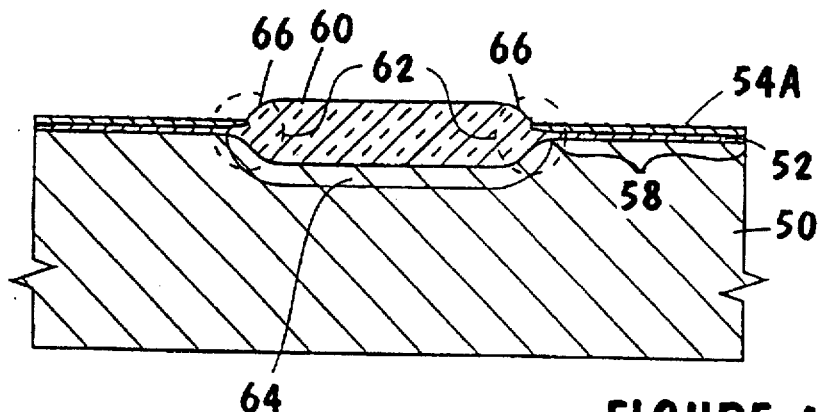
FIGS. 4BB-4CC are schematic cross sectional views illustrating a portion of a silicon substrate during formation of a field isolation structure in accordance with the invention wherein an optional mask thinning step is used to protect the active areas during a dry etch step.
Figure 4C:
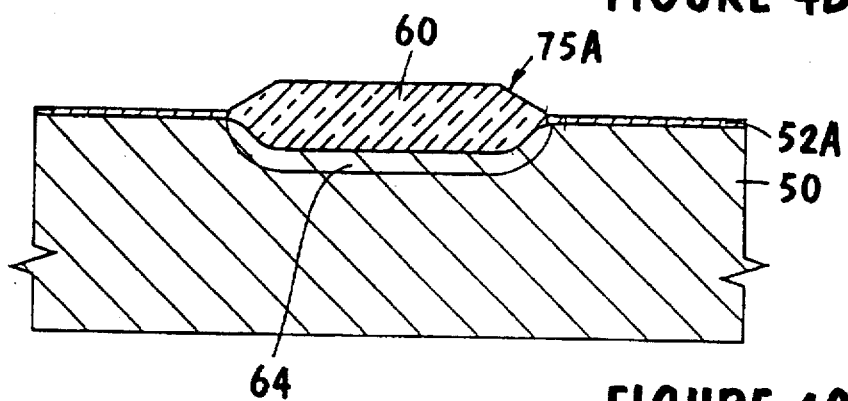

In order to insure that the active area 58 remains protected, during the tapering step FIGS. 4BB–4CC and 5BB–5CC illustrate two different approaches. In FIG. 4BB, the field oxide 60 has been formed substantially as shown in FIGS. 3A and 3B. However, in this case the nitride mask 54 (FIG. 3B) is only partially stripped such that a relatively thin mask 54A remains. The thin mask 54A can be formed by controlling a hot phosphoric etch, as previously described, such that enough of the original mask 54 remains to protect the active area 58 during the subsequent etch step (FIG. 4CC). However, enough of the original mask 54 must be removed to allow a subsequent etch process to form the field oxide 60 with a sloped surface 75A. By way of example, the thin mask 54A can be formed with a thickness of from 500 Å to 800 Å. Following such an etch process as previously described, the thin mask 54A can be stripped using another non-critical hot phosphoric wet etch. This adds one additional step to the process that is described as step 44 in FIG. 2. Also following the etch process, the pad oxide 52 can be stripped and a gate oxide 52A (FIG. 4CC) can be grown or deposited to a desired thickness (e.g., 100 Å). For a $SiO_2$ pad oxide 52, the pad oxide 52 can be stripped with a wet etchant such as HF acid or a dry etch performed with a fluorine etching species such as $CHF_3$, $CF_4$, and $NF_3$.

Figure 5B:
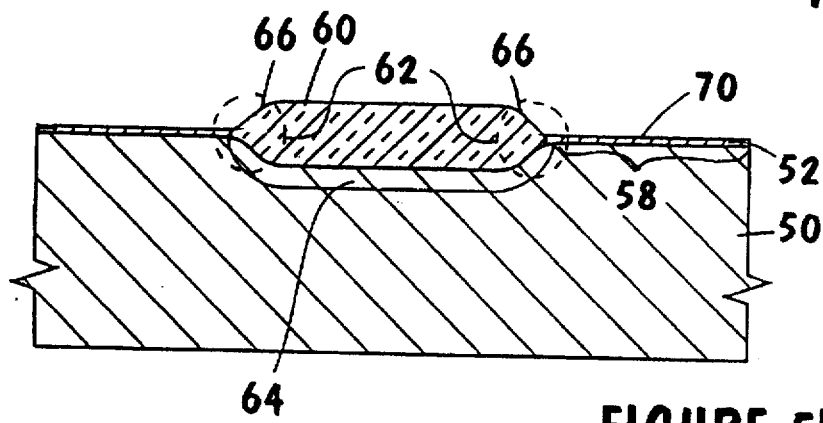
FIGS. 5BB-5CC are schematic cross sectional views illustrating a portion of a silicon substrate during the formation of a field isolation structure in accordance with the invention wherein an optional thick sacrificial oxide is used to protect the active areas during a dry etch step.
Figure 5C:
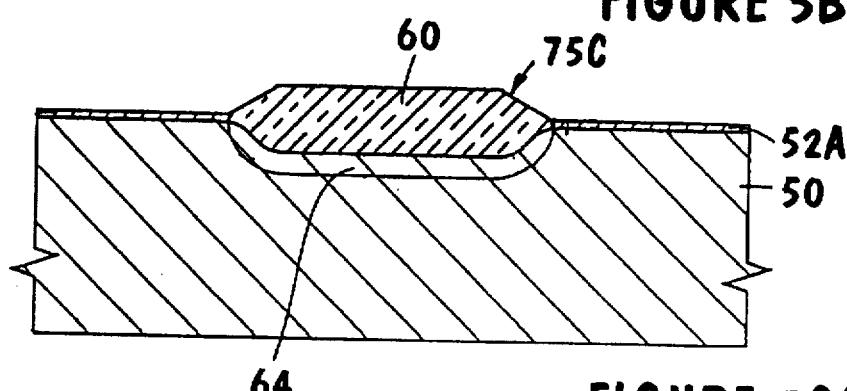

Another approach for protecting the active areas 58 during the etch step is shown in FIGS. 5BB and 5CC. In FIG. 5BB, the field oxide 60 has been formed substantially as shown in FIGS. 3A and 3B and the nitride mask 54 has been stripped. Prior to the etch step, the pad oxide 52 (FIG. 3B) is stripped and a sacrificial oxide 70 (FIG. 5BB) is grown or deposited in its place. The sacrificial oxide 70 is formed with a thickness (e.g., 500–800 Å) that is thick enough to protect the active area 58 during the etch step to form a sloped surface 75B. The optional sacrificial oxide step is described as step 46 in FIG. 2. Following the etch process the sacrificial oxide 70 can be stripped as previously described and a gate oxide 52A can be grown or deposited to a desired thickness (e.g., 100–200).

Figure 6:
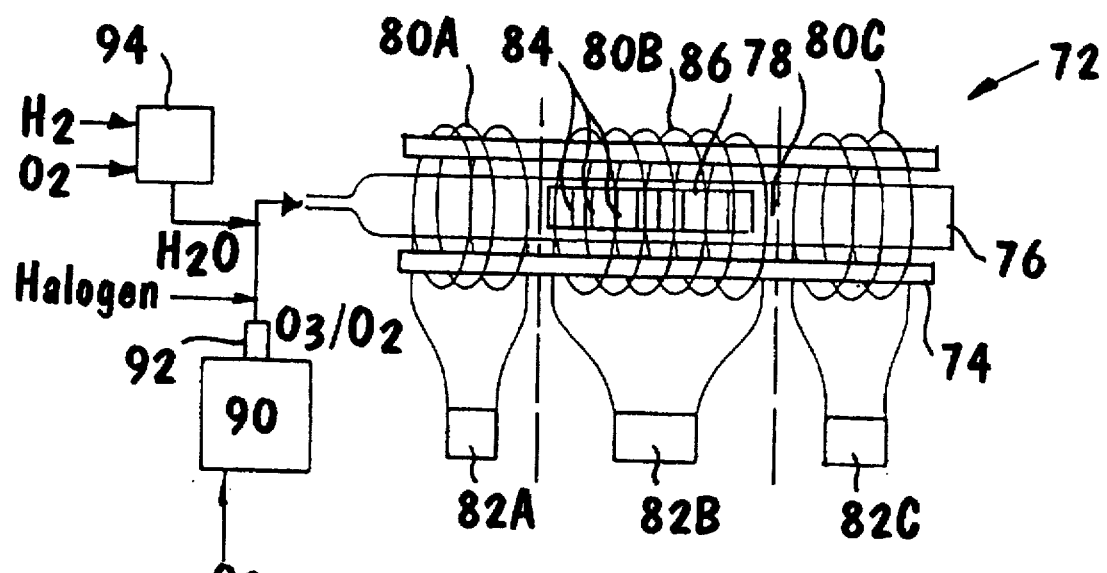
FIG. 6 is a schematic diagram of an apparatus constructed in accordance with the invention as a horizontal tube furnace for oxidizing silicon using an ozone/oxygen atmosphere.

Referring now to FIG. 6, an apparatus 72 constructed in accordance with the invention for oxidizing silicon utilizing an ozone/oxygen chemistry is shown. In the embodiment illustrated in FIG. 6, the apparatus 72 is constructed as a horizontal tube furnace that has been modified to operate with an oxidation atmosphere that contains ozone ($O_3$) as well as oxygen ($O_2$) Suitable horizontal tube furnaces are commercially available from the Silicon Valley Group (SVG) and other furnace manufacturers.

The apparatus 72 includes an elongated outer tube 74 formed of a ceramic material such as mulite. Inside of the outer tube 74 is an oxidation tube 76 formed of a material such as quartz. A reaction chamber 78 is contained within the oxidation tube 76. Heating coils 80A, 80B and 80C formed of copper tubing or other electrically conductive material are mounted on an inside surface of the outer tube 74. Each heating coil 80A, 80B and 80C is connected to a power supply 82A, 82B and 82C. Each of the heating coils 80A, 80B and 80C defines a zone within the reaction chamber 78. A source zone is associated with heating coil 80A, a center zone is associated with heating coil 80B and a load zone is associated with heating coil 80C. Within the source zone, the initial heating of the incoming gases to form an oxidizing atmosphere takes place. Within the center zone, the bulk of the oxidation process occurs. The load zone is adjacent to a load station for loading and unloading semiconductor wafers 84. Temperature controls are associated with each zone of the reaction chamber 78.

During the oxidation process, semiconductor wafers 84 are mounted on a holder 86 and transported to the center zone of the reaction chamber 78. Automated loading equipment may be provided for automatically loading and unloading the wafers 84 and holder 86. During the oxidation process the reaction chamber 78 is maintained at a temperature of from 600° C.–1300° C. For growing a field oxide 60 (FIG. 3B), the wafers 84 can be subjected to an oxidizing atmosphere for several hours.

An ozone generator 90 is in flow communication with the reaction chamber 78. The ozone generator 90 is adapted to inject ozone ($O_3$) and oxygen ($O_2$) at a predetermined flow rate and ratio of ozone to oxygen into the reaction chamber 78. The concentration of the ozone as a percentage of oxygen is preferably from about 0.5% to about 25% by volume (i.e., % vol. $O_3$/% vol. $O_2$=0.5 to 25). The ozone generator 90 can be a commercially available unit such as a silent discharge ozone generator. Suitable ozone generators are manufactured by PCI, Astex and Griffin Techniques Corp. and other manufacturers. In general, the ozone generator 90 is in flow communication with a source of pure oxygen and converts a portion of the oxygen to ozone.

In addition to being supplied to the reaction chamber 78 at a predetermined ratio of ozone to oxygen, the ozone/oxygen mixture is also transported to the reaction chamber 78 at a predetermined temperature. This may be accomplished using a heat exchanger 92 operably associated with the ozone generator 90 to cool the gas mixture exiting from the ozone generator 90. The temperature of the ozone/oxygen mixture is room temperature or less, preferably about 10° C. to about 25° C. Cooling the incoming ozone/oxygen mixture to a predetermined temperature helps to maintain the stability of the mixture during transport and injection into the reaction chamber 78. Specifically, cooling the incoming gas mixture helps to prevent the ozone in the mixture from converting back to oxygen.

A flow rate of the ozone/oxygen mixture will be dependent on the temperature and pressure of the reaction chamber 78 and on the number of wafers 84 being oxidized. Representative flow rates are on the order of 400 standard cubic centimeters per minute (sccm) to 20 or more standard liters per minute.

The reaction chamber 78 is preferably maintained at a negative pressure using a suitable evacuation apparatus such as a pump. Although the oxidation process may be performed at atmospheric pressure or greater, pressures from about one atmosphere to about 300 torr are preferred. A preferred pressure for growing a field oxide 60 (FIG. 3B) is on the order of 300–750 torr.

Furthermore, for growing a field oxide 60 (FIG. 3B), vapor ($H_2O$) can be added to the ozone/oxygen gas mixture or injected directly into the reaction chamber 78. An external torch 94 coupled to a source of $H_2$ and $O_2$ can be used to produce the $H_2O$. The water vapor can be in the form of steam added to a concentration of about 10% to about 99% of the total volume of the oxidizing atmosphere.

The oxidizing atmosphere can also include traces of a halogen gas such as $F_2$, $Cl_2$ or $Br_2$ or a gaseous halogen compound such as HF, HCl or $HB_r$. The amounts of the halogen or halogen compound present are chosen such that halogen etching is not the dominant mechanism. The presence of the halogen provides a synergistic effect which tends to enhance the oxidation process. Relative concentrations of the halogen or halogen compound to ozone are preferably about 1:10 to about 1:1000.

The ozone/oxygen mixture, $H_2O$ and/or halogen gas are injected into the reaction chamber 78 and heated by the heating coils 80A, 80B and 80C to a temperature of 600° C. to 1300° C. This forms an oxidizing atmosphere that oxidizes the silicon wafers 84 at a faster rate than with an oxidizing atmosphere not containing ozone. The faster oxidation rate permits the use of lower oxidation temperatures. As an example, oxidation may proceed at a relatively low temperature of 600° C. In addition, due to the faster oxidation rate, the oxide is formed with less stress with respect to the underlying substrate and with reduced lateral encroachment with respect to an edge of an oxidation mask. Furthermore, an oxidizing atmosphere containing ozone is less viscous than an oxidizing atmosphere containing only diatomic oxygen ($O_2$) and flows more effectively over the substrate. This permits thin oxides to be formed over tight geometries.

EXAMPLE 1

FIGS. 3B, 4BB and 5BB illustrate a field oxide 60 obtained using a silicon nitride mask 54 and oxidation of the exposed substrate 50 in an oxidizing atmosphere containing ozone. The profile depicted in FIGS. 3B, 4B and 5BB corresponds to the profile of the isolation geometry within the cell array of an in-process Micron Semiconductor, Inc. D21, 4-megabit dynamic random access memory, as observed with an electron scanning microscope.

Oxidation was performed using a Silicon Valley Group (SVG) vertical furnace and a gas flow rate of 5 standard liters/minute. Pressure within the reaction chamber was 350 torr at a temperature of 1007° C. The composition of the ozone/oxygen gas mixture injected into the reaction chamber was 5% $O_3$ by volume in bulk $O_2$. The ozone/oxygen mixture was cooled to a temperature of about 21.5° C. prior to injection into the process chamber of the furnace. Other wafers were processed using two percent $O_3$ in bulk $O_2$, as well as approximately seven percent $O_3$ in bulk $O_2$. Steam was injected into the process chamber. Oxidation occurred for a period of 10 hours.

It was clear from the experiment that the oxidation rate increased and lateral encroachment was reduced as ozone concentration increased. Further, it will be noted that the size of the bird's beak in the encroachment region is approximately one-third the size of the bird's beak obtained with a conventional LOCOS process (see FIG. 1B). It will also be noted that field implant encroachment is also reduced.

In addition, the oxidation rate with an oxidizing atmosphere containing ozone was increased. A conventional LOCOS process using $O_2$ only that takes about 17 hours to grow a FOX of about 4000 Å can be performed using an ozone/oxygen mixture in about 10–12 hours. This represents an increase in the rate of oxidation of about one third over conventional LOCOS processes.

Thus the invention provides an improved method and apparatus for forming a field isolation structure by oxidizing silicon using an ozone/oxygen chemistry followed by an etch step to taper a topography of the field oxide. Although the method and apparatus of the invention have been described with reference to certain preferred embodiments, as will be apparent to those skilled in the art, certain changes and modifications can be made without departing from the scope of the invention as defined by the following claims.

What is claimed is:

1. A method for forming a field isolation structure for a semiconductor device comprising:

forming a silicon substrate having active areas and isolation areas;

forming a mask on the substrate having openings on the isolation areas and solid portions on the active areas;

forming a field oxide in the isolation areas using an oxidation atmosphere comprising oxygen and ozone; and dry etching a surface of the field oxide to form a tapered surface.

2. The method as recited in claim 1 and further comprising removing at least a portion of the mask prior to the dry etching step.

3. The method as recited in claim 1 and further comprising forming a sacrificial oxide on the active areas to protect the active areas during the dry etching step.

4. The method as recited in claim 1 and further comprising leaving a portion of the mask on the active areas during the dry etching step to protect the active areas.

5. The method as recited in claim 1 and wherein the dry etching step comprises a facet etch wherein a corner portion of the field oxide is removed.

6. The method as recited in claim 1 and further comprising following the dry etching step depositing a conductive layer on the field oxide, patterning the conductive layer and etching the conductive layer without leaving residual material.

7. The method as recited in claim 1 and wherein the oxidation atmosphere comprises ozone and oxygen combined in a ratio of ozone to oxygen of 0.5% to 25% by volume.

8. The method as recited in claim 1 and wherein the oxidation atmosphere comprises a halogen.

9. The method as recited in claim 1 and wherein the oxidation atmosphere is heated to a temperature of between 600° C. to 1300° C.

10. The method as recited in claim 1 and wherein the ozone and oxygen for the oxidation atmosphere are mixed at a temperature of between 10° C. to 25° C.

11. The method as recited in claim 1 and wherein the oxidation atmosphere is at a pressure of between 300 to 750 torr.

12. The method as recited in claim 1 and wherein the oxidation atmosphere comprises vapor $H_2O$.

13. A method for forming a field isolation structure for a semiconductor device comprising:

forming a silicon substrate having active areas and isolation areas;

forming a mask on the substrate having openings aligned with the isolation areas and solid portions aligned with the active areas;

placing the substrate in a reaction chamber heated to a temperature of between 600° C. to 1300° C. and containing an oxidation atmosphere comprising ozone and oxygen combined in a ratio of ozone to oxygen of between 0.5% to 25% by volume for a time period sufficient to grow a field oxide of a desired thickness in the isolation areas; and dry etching a surface of the field oxide to form a tapered surface using a process selected from the group consisting of sputter etching, ion milling, reactive ion etching and plasma etching.

14. The method as recited in claim 13 and wherein the field oxide is grown with a stepped surface and the dry etching step removes a corner portion of the stepped surface.

15. The method as recited in claim 13 and wherein the dry etching step comprises a facet etch wherein a corner portion of the field oxide is removed.

16. The method as recited in claim 13 and further comprising removing at least a portion of the mask prior to the dry etching step.

17. The method as recited in claim 13 and further comprising removing the mask and forming a sacrificial oxide on the active areas prior to the dry etching step.

18. The method as recited in claim 13 and further comprising forming a sacrificial oxide on the active areas prior to forming the mask to protect the active areas during the dry etching step.

19. The method as recited in claim 13 and wherein the dry etching step uses an etching species selected from the class consisting of argon, helium and xenon.

20. The method as recited in claim 13 and wherein the desired thickness of the field oxide is from 2000 Å to 6000 Å.

21. The method as recited in claim 13 and wherein the ozone and oxygen are mixed prior to injection into the reaction chamber at a temperature of between 10° C. to 25° C.

22. The method as recited in claim 13 and v wherein the oxidation atmosphere comprises a halogen compound.

23. A method for forming a field isolation structure for a semiconductor device comprising:

forming a silicon substrate, having active areas and isolation areas;

forming a mask on the substrate to protect the active areas;

forming a field oxide in the isolation areas using the mask and an oxidation atmosphere comprising ozone and oxygen combined in a ratio of ozone to oxygen of 0.5% to 25% by volume;

removing at least a portion of the mask; and dry etching a portion of the field oxide to form a faceted surface Using a process selected from the group consisting of sputter etching, ion milling, reactive ion etching and plasma etching.

24. The method as recited in claim 23 and further comprising forming a sacrificial oxide on the active areas prior to the dry etching step.

25. The method as recited in claim 23 and further comprising removing a portion of the mask prior to the dry etching step using a first wet etch and then removing a remainder of the mask after the dry etching step using a second wet etch.

26. The method as recited in claim 25 and wherein the mask comprises silicon nitride and wherein the first wet etch and second wet etch are performed using phosphoric acid.

27. The method as recited in claim 23 and wherein the forming the field oxide step is performed in a reaction chamber of a tube furnace.

28. The method as recited in claim 27 and wherein the tube furnace is in flow communication with an ozone generator.

29. The method as recited in claim 28 and wherein the ozone and oxygen are mixed prior to injection into the reaction chamber at a temperature of 10° C. to 25° C.

30. The method as recited in claim 23 and wherein the dry etching step comprises etching with a gas species selected from the group consisting of argon, helium and xenon.

31. The method as recited in claim 23 and wherein the dry etching step removes from 200–800 Å of material from the field oxide.

32. The method as recited in claim 23 and wherein the field oxide is formed with a stepped surface and the dry etching step removes a corner of the stepped surface.

33. A method for forming a field isolation structure for a semiconductor device comprising:

forming a silicon substrate having active areas and isolation areas;

forming a mask on the substrate having openings on the isolation areas and solid portions on the active areas;

forming a field oxide in the isolation areas using an oxidation atmosphere comprising oxygen and ozone; and chemically mechanically planarizing a surface of the field oxide to form a tapered surface.

34. A method for forming a field isolation structure for a semiconductor device comprising:

forming a silicon substrate having active areas and isolation areas;

forming a mask on the substrate having openings on the isolation areas and solid portions on the active areas;

forming a field oxide in the isolation areas using an oxidation atmosphere comprising oxygen and ozone, said field oxide including corner portions;

implanting a dopant into the field oxide; and dry etching the corner portions of the field oxide to form a tapered surface.

* * * * *